(12) United States Patent
Lundberg

(10) Patent No.: US 7,288,980 B2
(45) Date of Patent: Oct. 30, 2007

(54) MULTIPLE MODE CLOCK RECEIVER

(75) Inventor: James R. Lundberg, Austin, TX (US)

(73) Assignee: IP-First, LLC, Fremont, CA (US)

( * ) Notice: Subject to any disclaimer, the term of this patent is extended or adjusted under 35 U.S.C. 154(b) by 819 days.

(21) Appl. No.: 10/695,221

(22) Filed: Oct. 28, 2003

(65) Prior Publication Data

US 2004/0086061 A1    May 6, 2004

Related U.S. Application Data

(60) Provisional application No. 60/424,109, filed on Nov. 5, 2002.

(51) Int. Cl.
*G06F 1/04* (2006.01)
(52) U.S. Cl. ............... 327/298; 327/291; 327/294
(58) Field of Classification Search ........ 327/291–294, 327/298, 299, 165
See application file for complete search history.

(56) References Cited

U.S. PATENT DOCUMENTS

| | | | | |
|---|---|---|---|---|
| 4,839,855 A | | 6/1989 | Van Driel ................... 713/503 |
| 5,625,805 A | | 4/1997 | Fenwick et al. ............ 713/503 |
| 5,796,296 A | * | 8/1998 | Krzentz ...................... 327/545 |
| 5,818,884 A | | 10/1998 | Reymond ................... 375/354 |
| 5,850,157 A | * | 12/1998 | Zhu et al. ................... 327/295 |
| 6,294,940 B1 | * | 9/2001 | Kiehl .......................... 327/291 |
| 6,407,591 B1 | * | 6/2002 | Wong et al. .................. 327/63 |
| 6,459,306 B1 | * | 10/2002 | Fischer et al. ............... 327/67 |
| 6,583,657 B1 | | 6/2003 | Eckhardt et al. ............ 327/175 |
| 6,614,279 B2 | * | 9/2003 | Anders et al. .............. 327/291 |
| 6,703,894 B1 | * | 3/2004 | Stockstad et al. ........... 327/552 |
| 6,798,251 B1 | * | 9/2004 | Schafferer ..................... 327/52 |
| 6,972,607 B1 | * | 12/2005 | Chen et al. ................. 327/291 |
| 2003/0067359 A1 | | 4/2003 | Darabi et al. ................. 331/46 |

\* cited by examiner

*Primary Examiner*—Kenneth B. Wells
*Assistant Examiner*—Hai L. Nguyen
(74) *Attorney, Agent, or Firm*—Gary R. Stanford; Richard K. Huffman; James W. Huffman

(57) ABSTRACT

A multiple mode clock receiver including first and second input AC-coupled capacitors, first and second voltage dividers and a differential amplifier. The voltage dividers each include first and second junctions, respectively, coupled to the first and second AC-coupled capacitors, respectively. The differential amplifier has first and second inputs coupled to the first and second junctions, respectively, and an output providing an output clock signal that is aligned with an input clock signal provided through the AC-coupled capacitors. The multiple mode clock receiver is a single circuit that aligns the output clock signal to any one of multiple forms of input clock signals, including a sole single-ended clock signal, a single-ended clock signal with a corresponding reference signal, and a differential clock signal.

14 Claims, 4 Drawing Sheets

US 7,288,980 B2

MULTIPLE MODE CLOCK RECEIVER

CROSS-REFERENCE TO RELATED APPLICATIONS

This application claims the benefit of U.S. Provisional Application No. 60/424109, filed on Nov. 5, 2002, which is herein incorporated by reference for all intents and purposes.

FIELD OF THE INVENTION

The present invention relates to clock signal alignment, and more particularly to a multiple mode clock receiver that aligns an output clock signal with an input clock signal that is provided from either one of several common types, including a single-ended signal, a single-ended signal with a corresponding reference signal, and a differential signal.

DESCRIPTION OF THE RELATED ART

FIGS. 1A, 1B and 1C are block diagrams illustrating three different types of bus clock signals that are used to provide clocking for circuits or chips, including microprocessor chips. FIG. 1A shows a motherboard 101 including a clock generator 103 providing a single-ended clock signal (BCLK) to a microprocessor (MP) 105. The motherboard 101 exemplifies those that are designed for Intel® Pentium® II or Celeron® microprocessors or the like, where the BCLK signal is a sole single-ended 2.5 Volt (V) signal. FIG. 1B shows another motherboard 111 including a clock generator 113 providing a single-ended 2.5 V BCLK signal and a corresponding 1.25 V midpoint reference signal (REF) to a microprocessor 115. The motherboard 111 exemplifies those that are designed for Pentium® III processors or the like. FIG. 1C shows yet another motherboard 121 including a clock generator 123 providing a 1.25 V differential bus clock signal, shown collectively as BCLK and BCLKB, to a microprocessor 125. The motherboard 121 exemplifies those that are designed for newer, low-voltage versions of the Pentium® III, also known as Tualatin®.

The function of an input clock receiver on a microprocessor chip is to provide an internal bus clock signal reference that is precisely aligned with an externally provided bus clock signal. Alignment of the internal signal with the externally provided bus clock signal is not a trivial problem because bus clock signals are provided in several different forms as illustrated in FIGS. 1A-1C. These different forms or clock types generally exhibit voltage levels that are much higher than microprocessor core levels and rise/fall times that are orders of magnitude slower (bus clock edges are measured in nanoseconds (ns) versus picoseconds (ps) for microprocessors). Prior art techniques have employed a number of different clock receiver circuits that are specifically suited towards reception and alignment of a specific form of bus clock signal.

Requiring a different clock receiver circuit for each different type of bus clock signal either precludes the use of a single chip design for each of the three exemplary motherboards 101, 111 and 121, or it necessitates that conversion circuits be added to a motherboard whose bus clock signal is incompatible with the clock receiver on a microprocessor chip, or it necessitates that multiple receivers be provided within a single microprocessor design. The third option with multiple receivers further requires means for enabling or disabling applicable or non-applicable receivers based upon the specific bus clock form that is provided by a host motherboard.

SUMMARY OF THE INVENTION

A multiple mode clock receiver according to an embodiment of the present invention includes first and second input AC-coupled capacitors, first and second voltage dividers and a differential amplifier. The first and second input AC-coupled capacitors include first and second N-channel devices, respectively, each having a source and a drain coupled together at respective input and gate coupled to a corresponding one of a first junction and a second junction. The voltage dividers are each coupled between DC source voltages (e.g., VDD and ground) and include the first and second junctions, respectively, coupled to the first and second AC-coupled capacitors, respectively. The differential amplifier has a first input coupled to the first junction and a second input coupled to the second junction. The differential amplifier has an output providing an output clock signal that is aligned with an input clock signal provided through at least one of the input AC-coupled capacitors.

The multiple mode clock receiver is a single circuit that aligns the output clock signal to any one of multiple forms of input clock signals, such as those prevalently used in existing microprocessor motherboards. A first form is a sole single-ended clock signal provided through the first AC-coupled capacitor. A second form is a single-ended clock signal and a corresponding reference signal provided through the first and second AC-coupled capacitors, respectively. A third form is a differential clock signal including first and second complementary signals provided through the first and second AC-coupled capacitors, respectively.

In an exemplary configuration, the multiple mode clock receiver is implemented using N-channel and P-channel devices. The AC-coupled capacitors may be implemented using N-channel devices configured as capacitors, each having its source and drain coupled together at a respective input. In one embodiment, these N-channel devices are matched with each other. Each of the voltage dividers may be implemented using a pair of P-channel devices, each configured as a resistor. In one embodiment, the corresponding P-channel devices forming the voltage dividers are matched. The differential amplifier may also be implemented with P-channel and N-channel devices.

In one embodiment, the N-channel devices forming the AC-coupled capacitors are sized to overcome parasitic capacitances of the P-channel devices of the voltage dividers. An additional pair of relatively weak N-channel devices may be included and coupled to the clock inputs and the voltage divider junctions to stabilize the differential amplifier in the event of clock shutdown.

An integrated circuit (IC) according to an embodiment of the present invention includes first and second input pins, first and second capacitors, first and second voltage dividers, and a differential amplifier. Each capacitor has a first end coupled to an input pin and a second end coupled to a junction of a corresponding voltage divider. The first and second capacitors include first and second N-channel devices, respectively, each having its source and a drain coupled together at the first end and a gate forming the second end. The differential amplifier has a differential input including a first input coupled to a junction of the first voltage divider and a second input coupled to the junction of the second voltage divider. The differential amplifier further has an output which provides an output clock signal that is aligned with an input clock signal provided to at least one of the first and second input pins.

In one embodiment of the IC, the first input pin is selectively coupled to either a single-ended clock signal or a first polarity of a differential clock signal. The second input pin is selectively disconnected or coupled to either one of a reference signal or a second polarity of the differential clock signal. In alternative embodiments, the IC may be operated in any one of multiple modes, including a first mode when the first input pin receives a single-ended clock signal and the second input pin is floated, a second mode when the first input pin receives a single-ended clock signal and the second input pin receives a reference signal, and a third mode when the first and second input pins receive first and second polarities of a differential clock signal. The IC may be implemented using N-channel and P-channel devices in a similar manner as described above.

A printed circuit board (PCB) according to an embodiment of the present invention includes a clock generator and a chip. The clock generator asserts a bus clock signal on one or more signal lines. The chip includes first and second clock input pins coupled to the one or more signal lines and a clock receiver. The clock receiver includes first and second AC-coupled capacitors, first and second voltage dividers, and a differential amplifier having an output providing an internal clock signal that is aligned with the bus clock signal.

The clock generator on the PCB may be implemented according to any one of multiple types. In one configuration, the clock generator provides a single-ended clock signal on one signal line provided to the first clock input pin of the chip, where the second clock input pin is left floating. In a second configuration, the clock generator further provides a reference signal on a second signal line provided to the second clock input pin of the chip. In a third configuration, the clock generator provides a differential clock signal on first and second signal lines, which are provided to the first and second clock input pins, respectively, of the chip.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventors of the present application have recognized the need for aligning an internal core clock signal with an external bus clock signal, which is provided in any one of the different forms previously discussed, which generally exhibit prohibitively high voltage levels and relatively slow rise/fall times. They have therefore developed a multiple mode clock receiver, which is a single apparatus that aligns a core clock signal with any of the different clock types prevalently used, as will be further described below with respect to FIGS. 2-5.

Figure 1A:
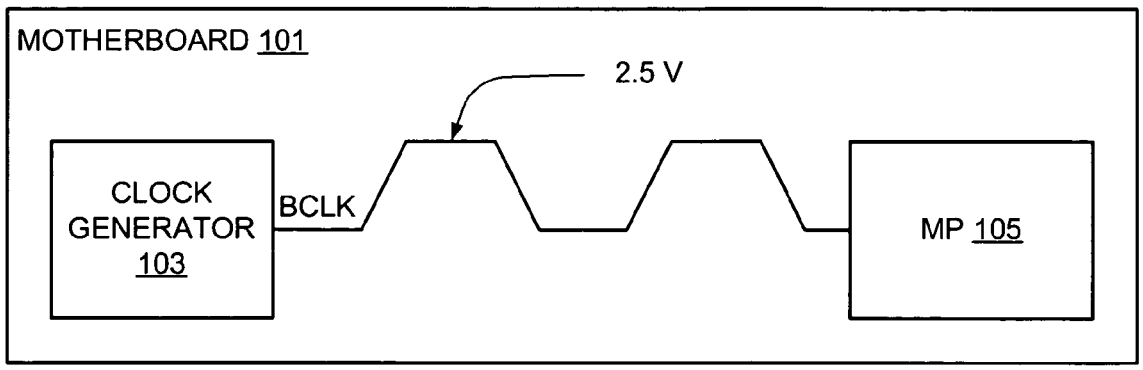
FIGS. 1A, 1B and 1C are block diagrams illustrating three different types of bus clock signals that are used to provide clocking for circuits or chips, including microprocessor chips.
Figure 1B:
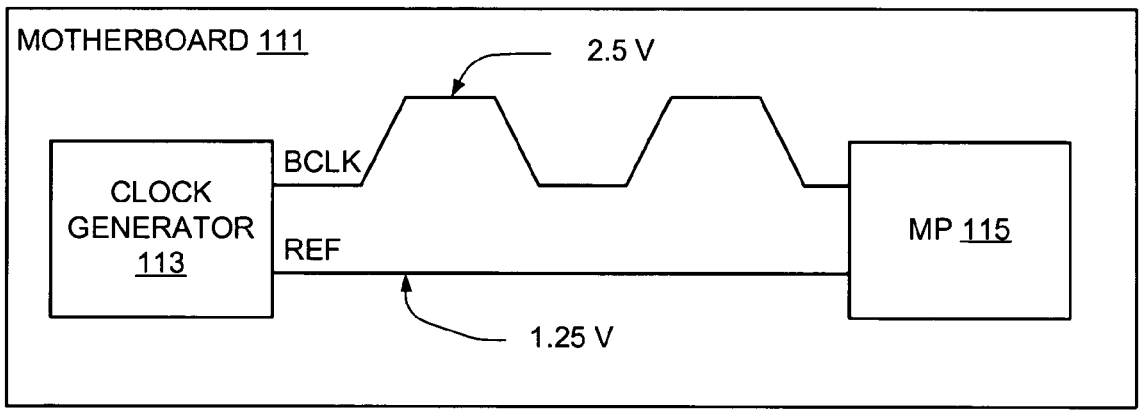
Figure 1C:
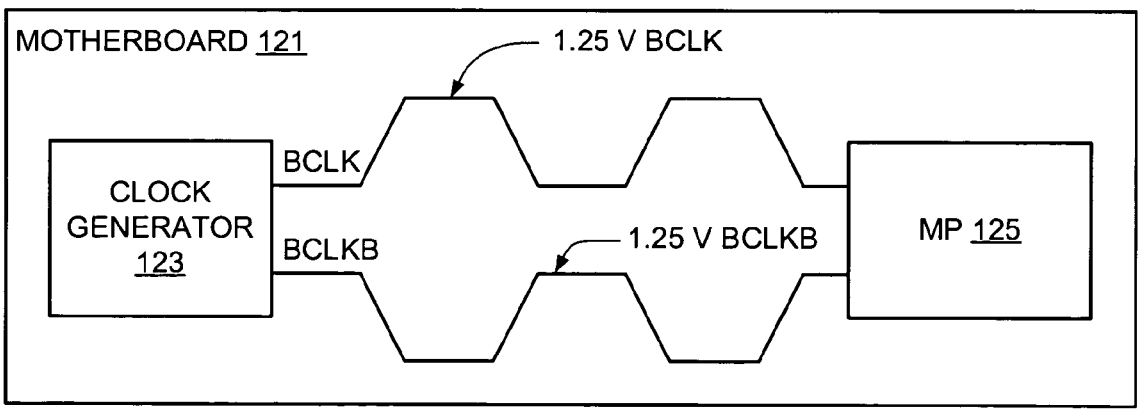
Figure 2:
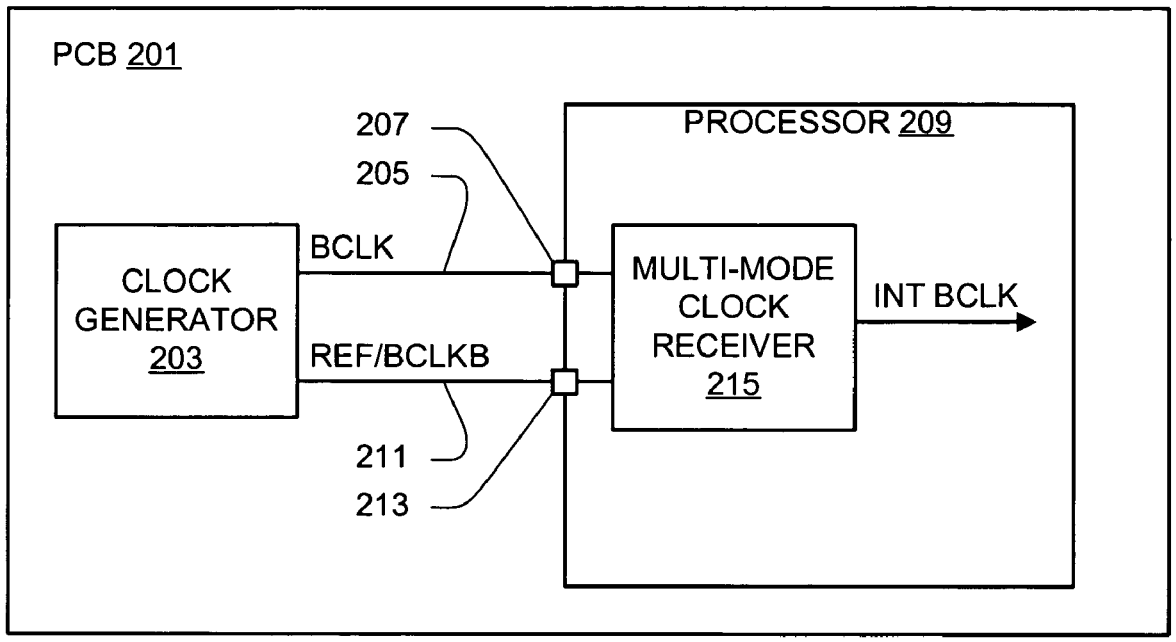
FIG. 2 is a block diagram of a printed circuit board (PCB) including a processor incorporating a multiple mode clock receiver implemented according to an embodiment of the present invention.

FIG. 2 is a block diagram of a printed circuit board (PCB) 201 including a processor 209, which further includes a multiple mode clock receiver 215 implemented according to an embodiment of the present invention. In one embodiment, the PCB 201 is a motherboard for a computer system (not shown) and the processor 209 is a microprocessor chip. One skilled in the art will appreciate, however, that the present invention is not limited to motherboards and/or microprocessors but is applicable in general to any type of PCB and processing system or apparatus. The processor 209, for example, may be any type of processing function provided on an integrated circuit (IC) or chip or implemented using discrete components. For embodiments in which the processor 209 is an IC or processor chip mounted on the PCB 201, the multiple mode clock receiver 215 is integrated thereon so that the processor is compatible with any of the multiple types of bus clocks.

A generic clock generator 203 is shown which provides a signal BCLK on a signal line 205 to a first clock input pin 207 of the processor 209. The clock generator 203, depending upon its configuration, optionally provides a second clock signal on a second signal line 211 to a second clock input pin 213 of the processor 209. The second clock signal, if provided, is a reference signal REF for a corresponding single-ended clock signal, or is a second polarity of a differential clock signal BCLK/BCLKB. Thus, the clock generator 203 may be configured as any of the clock generators 103, 113 or 123 previously described.

For a sole single-ended clock signal similar to that provided by the clock generator 103, the BCLK signal is a single-ended 2.5 V bus clock signal and the REF/BCLKB signal is omitted. The second signal line 211 is omitted or otherwise disconnected for the sole single-ended clock signal configuration. For a single-ended clock signal with a corresponding reference signal similar to that provided by the clock generator 113, the BCLK signal is a single-ended 2.5 V bus clock signal and the REF/BCLKB signal is a 1.25 V midpoint REF signal. For a differential clock signal similar to that provided by the clock generator 123, the BCLK and BCLKB signals collectively form a 1.25 V differential bus clock signal.

The multiple mode clock receiver 215 is coupled to the clock input pins 207 and 213 for receiving the BCLK signal and the REF or BCLKB signal, if provided. The multiple mode clock receiver 215 provides a corresponding internal core clock signal (INT CLK) based on the input bus clock signal. The multiple mode clock receiver 215 operates to align the INT CLK signal with BCLK signal for any of the BCLK signal types previously described. In particular, the multiple mode clock receiver 215 operates according to any one of at least three modes of operation depending upon the type of input clock signal, including a first mode for a sole single-ended clock signal, a second mode for a single-ended clock signal with a corresponding reference signal, and a third mode for a differential clock signal.

Figure 3:
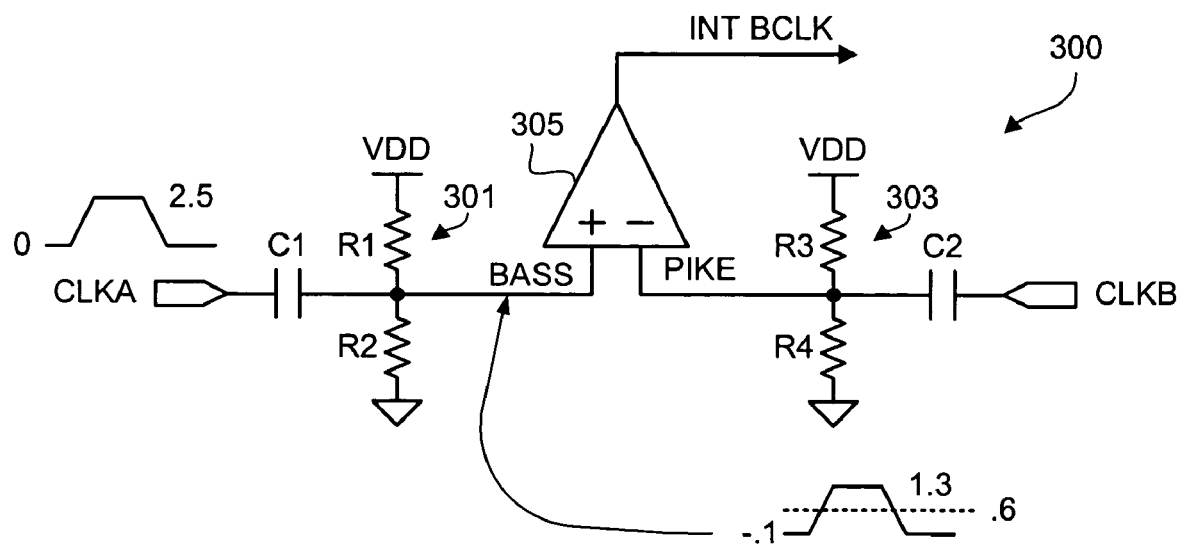
FIG. 3 is a simplified effective schematic diagram of an exemplary circuit embodiment of the multiple mode clock receiver of FIG. 2.

FIG. 3 is a simplified effective schematic diagram of an exemplary circuit embodiment of the multiple mode clock receiver 215 of FIG. 2, shown as a multiple mode clock receiver 300. The multiple mode clock receiver 300 includes first and second input clock nodes CLKA and CLKB, which are coupled to the clock input pins 207 and 213, respectively, when used as the multiple mode clock receiver 215. The CLKA node is coupled to one end of a first input AC-coupled capacitor C1, having its other end coupled to a node BASS. The CLKB node is coupled to one end of a second AC-coupled capacitor C2, having its other end coupled to a node PIKE. A first resistor R1 is coupled between a voltage source VDD and the BASS node and a second resistor R2 is coupled between the BASS node and ground. The resistors R1 and R2 form a voltage divider 301 that sets the bias voltage for the BASS node based on the voltage level of VDD. A third resistor R3 is coupled between VDD and the PIKE node and a fourth resistor R4 is coupled between the PIKE node and ground. The resistors R3 and R4 form a second voltage divider 303 relative to VDD that sets the bias voltage for the PIKE node in a similar manner as the voltage divider 301.

The BASS node is coupled to a non-inverting input of a differential amplifier 305 and the PIKE node is coupled to an inverting input of the differential amplifier 305. The output of the differential amplifier 305 provides the INT BCLK signal. The BCLK signal is provided to the CLKA node. If BCLK is a single-ended signal without a corresponding reference signal, then the CLKB node does not receive a signal and is otherwise left floating. If BCLK is a single-ended signal with the corresponding reference signal REF, then the REF signal is provided to the CLKB node. If BCLK is part of a differential signal BCLK/BCLKB, then the BCLKB signal is provided to the CLKB node. In one embodiment, the AC-coupled capacitors C1 and C2 are effectively matched with each other and the voltage dividers 301 and 303 are also effectively matched with each other.

In one embodiment particular to clock signals in the 0-2.5 V range (including differential voltages of 1.25 V), the voltage dividers 301 and 303 bias both of the BASS and PIKE nodes to approximately 0.6 V DC. For a 0-2.5 V single-ended BCLK signal provided to the CLKA node, the AC-coupled capacitor C1 removes the DC component of the BCLK signal, resulting in an AC signal having a peak-to-peak amplitude of approximately 1.4 V as seen at the BASS node. The amplitude of the signal on the BASS node is reduced because of losses through the AC-coupled capacitor C1 and the voltage divider 301. The voltage divider 301 also adds about 0.6 V to the AC signal to produce a DC-biased AC signal having an approximate range of +1.3 V to −0.1 V. The particular voltage range for BCLK of 0-2.5 V is exemplary only, where one of ordinary skill in the art will appreciate that the BASS and PIKE nodes switch with approximately equal amplitude excursions about the bias DC level (e.g., 0.6 V), where the amplitudes of the particular voltage excursions depend on the voltage range of the input bus clock signal(s). Also, the particular bias voltage level of the BASS/PIKE nodes in a given configuration depends on the voltage level of VDD, which is selected based on the particular processor type.

For the single-ended mode in which the CLKB node is allowed to float, the PIKE node provides a 0.6 V reference to the inverting input of the differential amplifier 305. Thus, INT BCLK signal switches when the voltage of the BASS node crosses through 0.6 V, where the BASS node crosses through 0.6 V at the midpoint of the BCLK signal. For the single-ended, midpoint reference mode in which a 1.25 V DC REF signal is provided to the CLKB node, operation is substantially identical since the DC reference is filtered out by the AC-coupled capacitor C2. Thus, the INT BCLK signal switches at the midpoint (1.25 V) of the BCLK signal. For differential mode of operation in which the CLKA/CLKB nodes receive the BCLK/BCLKB signals, respectively, since the AC-coupled capacitors C1 and C2 are effectively matched and the voltage dividers 301 and 303 are effectively matched, the BASS and PIKE nodes follow the edges of the BCLK and BCLKB signals, respectively, thus ensuring that the INT BCLK signal switches when the BCLK and BCLKB signals cross.

Figure 4:
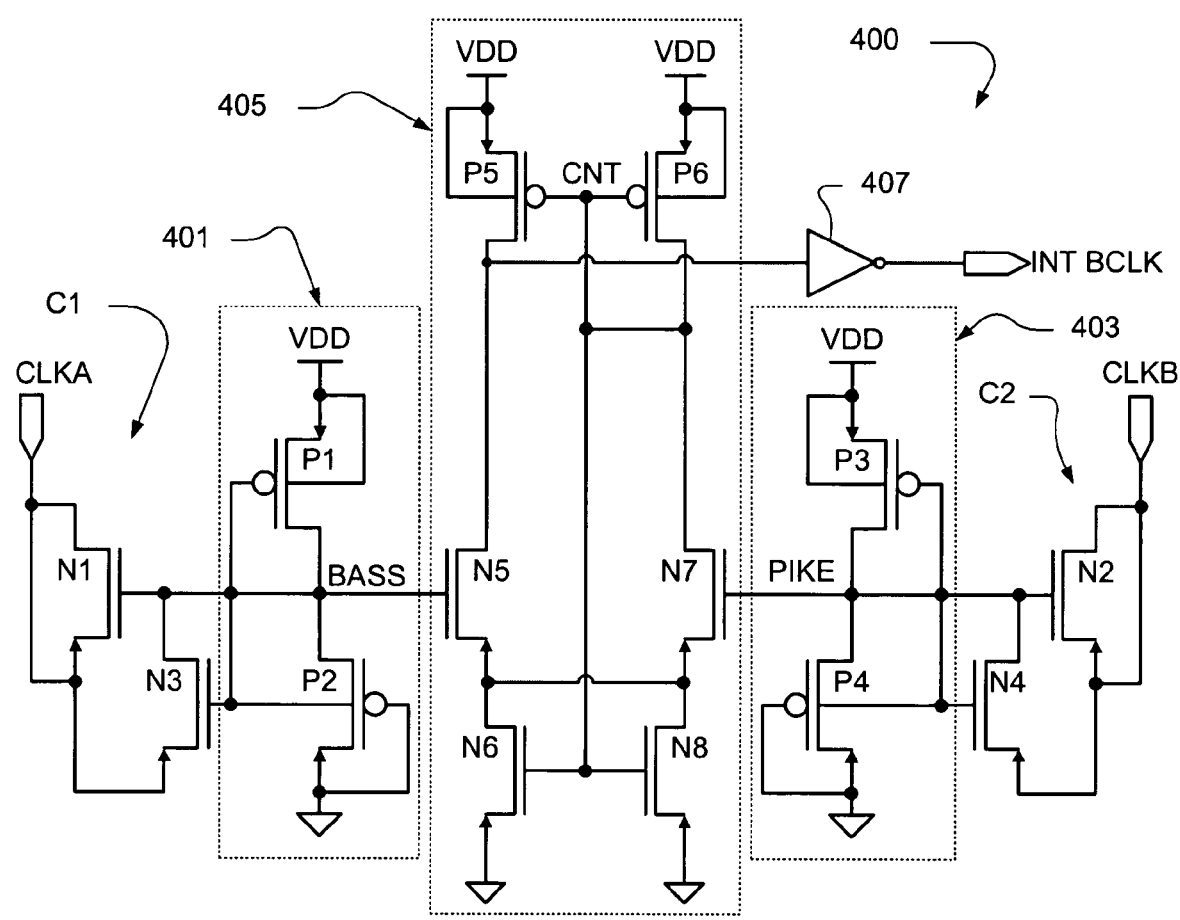
FIG. 4 is a detailed schematic diagram of an exemplary embodiment of the multiple mode clock receiver of FIG. 2 using P-channel and N-channel devices.

FIG. 4 is a detailed schematic diagram of an exemplary embodiment of the multiple mode clock receiver 215 of FIG. 2 using P-channel and N-channel devices, shown as the multiple mode clock receiver 400. The multiple mode clock receiver 400 also includes first and second input clock nodes CLKA and CLKB, which are coupled to the clock input pins 207 and 213, respectively, when used as the multiple mode clock receiver 215. The CLKA node is coupled to the gate and source of an N-channel device N1, having its gate coupled to the BASS node. The CLKB node is coupled to the gate and source of an N-channel device N2, having its gate coupled to the PIKE node. The N-channel devices N1 and N2 are configured as capacitors (having their sources and drains tied together) and implement the AC-coupled capacitors C1 and C2, respectively. A third N-channel device N3 has its source coupled to the CLKA node and its drain and gate coupled to the BASS node. A fourth N-channel device N4 has its source coupled to the CLKB node, and its drain and gate coupled to the PIKE node. Operation of the N-channel devices N3 and N4 is further described below.

A pair of P-channel devices P1 and P2 are coupled to the BASS node between VDD and ground to implement a voltage divider 401 similar to the voltage divider 301. In particular, the gate and drain of P1 is coupled to the BASS node and its source and substrate are coupled to VDD. The source and gate of P2 are coupled to ground and its drain and substrate are coupled to the BASS node. Thus, P1 and P2 are configured as resistors to form a similar configuration as the resistors R1 and R2. In a similar manner, another pair of P-channel devices P3 and P4 are coupled to the PIKE node between VDD and ground to implement a voltage divider 403 similar to the voltage divider 303. In particular, the gate and drain of P3 is coupled to the PIKE node and its source and substrate are coupled to VDD. The source and gate of P4 are coupled to ground and its drain and substrate are coupled to the PIKE node. Thus, P3 and P4 are configured as resistors to form a similar configuration as the resistors R3 and R4.

For embodiments particular to clock signals in the 0-2.5 V range, the P-channel devices P1 and P2 to provide a DC bias for the BASS node at approximately 0.6 V DC. In one embodiment, the P-channel devices P3 and P4 are matched to P1 and P2, respectively, so that the same DC bias of 0.6 V DC is provided on the PIKE node. Again, the particular bias voltage level also depends on the voltage level of VDD. Also, the N-channel devices N1 and N2 forming the input AC-coupled capacitors are also matched with each other. In one embodiment, N1 and N2 are sized sufficiently large so that their capacitances overcome the parasitic capacitances of the P-channel devices P1/P2 and P3/P4, respectively.

P-channel devices P5 and P6 and N-channel devices N5, N6, N7 and N8 are configured as a differential amplifier 405, which corresponds to the differential amplifier 305. In particular, the sources and substrates of P5 and P6 are coupled to VDD. The gates of P5 and P6 and the drain of P6 are coupled to a center node CNT. The drain of P5 is coupled to the drain of N5, which has its gate coupled to the BASS node and its source coupled to the source of N7. The drain of N7 is coupled to the CNT node and its gate is coupled to the PIKE node. The drain of, N6 is coupled to the source of N5 and the drain of N8 is coupled to the source of N7. The gates of N6 and N8 are coupled together at the CNT node. The sources of N6 and N8 are coupled to ground. An inverter 407 has its input coupled to the drain of P5, and its output provides the INT BCLK signal.

Operation of the multiple mode clock receiver 400 is substantially the same as the multiple mode clock receiver 300. In one embodiment particular to clock signals in the 0-2.5 V range (including differential voltages of 1.25 V), the voltage dividers 401 and 403 bias both of the BASS and PIKE nodes to approximately 0.6 V DC. For a 0 to 2.5 V single-ended BCLK signal provided to the CLKA node, N1 removes the DC component of the BCLK signal, resulting in an AC signal having a peak-to-peak amplitude of approximately 1.4 V as seen at the BASS node. The amplitude of the signal on the BASS node is reduced because of losses through N1 and the voltage divider 401 formed by P1 and P2. The voltage divider 401 also adds about 0.6 V to the AC signal to produce a DC-biased AC signal having an approximate range of 1.3 V to −0.1 V. Again, particular voltage ranges are exemplary only, where specific amplitude excursions vary depending upon the input and source voltage levels.

The N-channel devices N3 and N4 are relatively weak devices which are provided to preclude unstable operation of the differential amplifier 405 during shut down of the external clock signal BCLK. Clock shutdown is commonly experienced in low-power and other special function microprocessor motherboards. By specification in microprocessor motherboard embodiments, the BCLK goes to 0 V during a shutdown and the BCLKB signal goes to 1.25 V for the differential case. When these inputs go to DC levels, the multiple mode clock receiver 400 drives each of the BASS and PIKE nodes to 0.6 V. When the BCLK signal goes to 0 V, N3 drives the bias point of the BASS node to a voltage lower than 0.6 V. This is because when the BCLK signal goes to 0 V, the BASS node is initially lower than 0 V and will begin to rise in voltage. N3 turns on and keeps the BASS node at a lower voltage level than the PIKE node. Similarly, when the BCLKB signal shuts down to a 1.25 V level, N4 stays off. This occurs because the bus clock side of N4 becomes the drain when BCLKB is high, and this level is higher than PIKE (to which the source and gate of N4 are tied)

Hence, the differential amplifier 405 does not oscillate when the external bus clock is shut down. When BCLK goes to 0 V, the BASS node is lower than 0 V and begins to rise. N3 turns on and keeps the BASS node at a lower voltage than the PIKE node. In one embodiment, N3 and N4 are weak devices so that they do not interfere with the AC coupling or the operation of the voltage dividers 401, 403. Under normal oscillation conditions when the waveforms of the CLKA and BASS nodes (and the waveforms of the CLKB and PIKE nodes) are aligned, N3 and N4 are not on.

One advantage of a multiple mode clock receiver implemented according to an embodiment of the present invention is that a single circuit is provided for aligning an output clock signal with any one of several different types of externally-provided input clock signals. For integrated embodiments (ICs or chips), the multiple mode clock receiver is integrated and provides an internal clock signal that is aligned with an external clock signal having any one of multiple forms. Such is particularly advantageous for aligning an internal core clock signal on a microprocessor chip with different bus clock types provided from clock generation circuitry on a motherboard. Another advantage is that board modifications are not necessary for using a chip implemented with a multiple mode clock receiver according to embodiments of the present invention.

Figure 5:
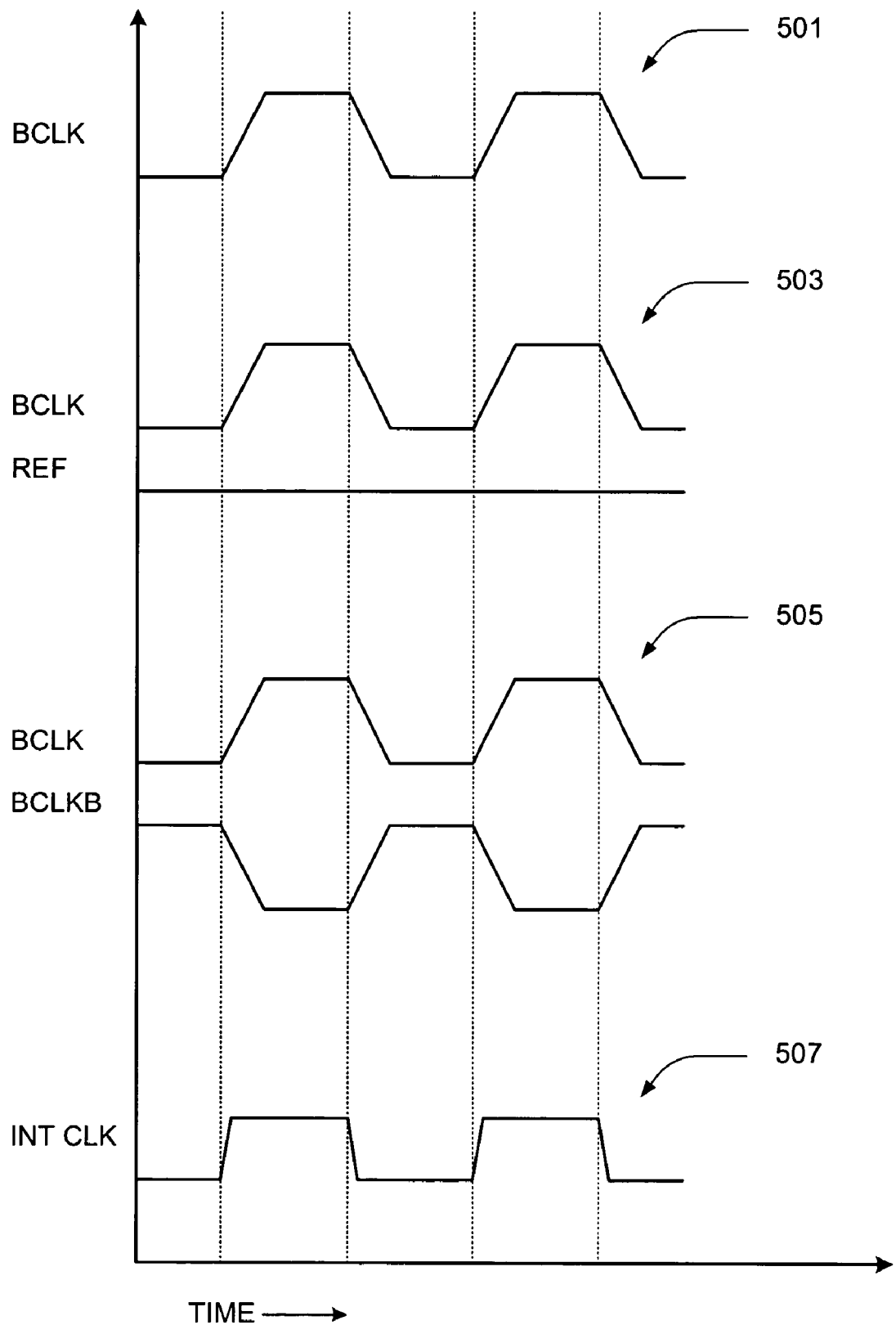
FIG. 5 is a simplified timing diagram generally illustrating alignment of the internal core clock signal for any of the externally-provided bus clock formats.

FIG. 5 is a simplified timing diagram generally illustrating alignment of the INT CLK signal for any of the bus clock formats previously described. The different bus clock forms include the sole single-ended bus clock shown at 501, the single-ended bus clock and corresponding reference signal shown at 503 and the differential bus clock shown at 505. For any of these formats, the INT CLK signal generated by the multiple mode clock receiver 300 or 400, shown at 507, is aligned with the input bus clock signal regardless of particular format. The voltage levels of the INT CLK signal is reduced to be compatible for the particular processor. Also, the rise and fall times of the INT CLK signal are faster due to fast switching of the differential amplifier in response to the slower transitions of the input clock signal.

Although the present invention has been described in considerable detail with reference to certain preferred versions thereof, other versions and variations are possible and contemplated. For example, the multiple mode clock receiver is shown in integrated form, but may be implemented using alternative forms such as using discrete components. Moreover, although the present disclosure contemplates one implementation using metal-oxide semiconductor (MOS) type devices, including complementary MOS devices and the like, such as, for example, NMOS and PMOS transistors, it may also be applied in a similar manner to different or analogous types of technologies and topologies, such as bipolar devices or the like.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. A multiple mode clock receiver, comprising:
    first and second input AC-coupled capacitors, wherein said first and second input AC-couple capacitors comprise first and second N-channel devices, respectively, each having a source and a drain coupled together at respective input and a gate coupled to a corresponding one of a first junction and a second junction;
    a first voltage divider coupled between DC source voltages and having said first junction coupled to said first input AC-coupled capacitor;
    a second voltage divider coupled between DC source voltages and having said second junction coupled to said second AC-coupled capacitor;
    a differential amplifier, having a differential input including a first input coupled to said first junction and a second input coupled to said second junction, and having an output;
    a third N-channel device having a source coupled to said source of said first N-channel device and a drain and a gate coupled to said first junction; and
    a fourth N-channel device having a source coupled to said source of said second N-channel device and a drain and a gate coupled to said second junction;
    wherein said output of said differential amplifier provides an output clock signal that is aligned with an input clock signal provided through at least one of said first and second input AC-coupled capacitors.

2. The multiple mode clock receiver of claim 1, wherein said third and fourth N-channel devices are provided to stabilize said differential amplifier in the event of clock shutdown.

3. The multiple mode clock receiver of claim 1, wherein said first and second voltage dividers each comprise:
    a first P-channel device having a source and a substrate coupled to a source voltage and a gate and a drain coupled to a corresponding one of said first and second junctions; and
    a second P-channel device having a source and gate coupled to ground and a drain and a substrate coupled to a corresponding one of said first and second junctions.

4. The multiple mode clock receiver of claim 3, wherein said first and second N-channel devices are sized to overcome parasitic capacitances of said first and second P-channel devices.

5. The multiple mode clock receiver of claim 3, wherein said first P-channel device of said first voltage divider is matched with said first P-channel device of said second voltage divider, and wherein said second P-channel device of said first voltage divider is matched with said second P-channel device of said second voltage divider.

6. The multiple mode clock receiver of claim 3, wherein said differential amplifier comprises:
   a fifth P-channel device having a source and a substrate coupled to a voltage source, a gate coupled to a center node and a drain;
   a sixth P-channel device having a source and a substrate coupled to said voltage source, and a gate and drain coupled together at said center node;
   a third N-channel device having a source, a gate coupled to said first junction, and a drain coupled to said drain of said fifth P-channel device;
   a fourth N-channel device having a drain coupled to said source of said third N-channel device, a gate coupled to said center node, and a source coupled to ground;
   a fifth N-channel device having a source coupled to said source of said third N-channel device, a gate coupled to said second junction, and a drain coupled to said drain of said sixth P-channel device; and
   a sixth N-channel device having a drain coupled to said source of said fifth N-channel device, a gate coupled to said center node, and a source coupled to ground.

7. The multiple mode clock receiver of claim 6, further comprising an inverter having an input coupled to said drain of said fifth P-channel device and an output providing said output clock signal.

8. An integrated circuit (IC), comprising:
   first and second input pins;
   a first capacitor having a first end coupled to said first input pin and a second end;
   a second capacitor having a first end coupled to said second input pin and a second end;
   said first and second capacitors comprise first and second N-channel devices, respectively, each having its source and a drain coupled together at said first end and a gate forming said second end;
   a first voltage divider coupled between DC sources and having a first junction coupled to said second end of said first capacitor;
   a second voltage divider coupled between DC sources and having a second junction coupled to said second end of said second capacitor;
   a differential amplifier, having a differential input including a first input coupled to said first junction and a second input coupled to said second junction, and having an output that provides an output clock signal that is aligned with an input clock signal provided to at least one of said first and second input pins;
   a third N-channel device having a source coupled to said source of said first N-channel device and a drain and gate coupled to said first junction; and
   a fourth N-channel device having a source coupled to said source of said second N-channel device and a drain and gate coupled to said second junction.

9. The IC of claim 8, wherein said first input pin is selectively coupled to either a single-ended clock signal or a first polarity of a differential clock signal and wherein said second input pin is selectively disconnected or coupled to either one of a reference signal or a second polarity of said differential clock signal.

10. The IC of claim 8, further comprising multiple modes of operation including a first mode when said first input pin receives a single-ended clock signal and said second input pin is floated, a second mode when said first input pin receives a single-ended clock signal and said second input pin receives a reference signal, and a third mode when said first and second input pins receive first and second polarities of a differential clock signal.

11. The IC of claim 8, wherein said first and second voltage dividers each comprise:
    a first P-channel device having a source and substrate coupled to a source voltage and a gate and a drain coupled to a corresponding one of said first and second junctions; and
    a second P-channel device having a source and gate coupled to ground and a drain and a substrate coupled to a corresponding one of said first and second junctions.

12. The IC of claim 11, wherein said first and second N-channel devices are sized sufficiently large to overcome parasitic capacitances of said first and second P-channel devices of each of said first and second voltage dividers and wherein said third and fourth N-channel devices are relatively weak devices.

13. The IC of claim 11, wherein said differential amplifier comprises:
    a fifth P-channel device having a source and a substrate coupled to a voltage source, a gate coupled to a center node and drain;
    a sixth P-channel device having a source and a substrate coupled to said voltage source, and a gate and drain coupled together at said center node;
    a fifth N-channel device having a source, a gate coupled to said first junction, and a drain coupled to said drain of said fifth P-channel device;
    a sixth N-channel device having a drain coupled to said source of said fifth N-channel device, a gate coupled to said center node, and a source coupled to ground;
    a seventh N-channel device having a source coupled to said source of said fifth N-channel device, a gate coupled to said second junction, and a drain coupled to said drain of said sixth P-channel device; and
    an eighth N-channel device having a drain coupled to said source of said seventh N-channel device, a gate coupled to said center node, and a source coupled to ground.

14. The multiple mode clock receiver of claim 13, further comprising an inverter having an input coupled to said drain of said fifth P-channel device and an output providing an output clock signal.

* * * * *